United States Patent
Yamada et al.

(10) Patent No.: US 6,849,486 B2
(45) Date of Patent: Feb. 1, 2005

(54) METHOD OF MANUFACTURING A THINNED GATE ELECTRODE UTILIZING PROTECTIVE FILMS AND ETCHING

(75) Inventors: Tetsuya Yamada, Tokyo (JP); Atsushi Ueno, Tokyo (JP); Kouichirou Tsujita, Tokyo (JP); Atsumi Yamaguchi, Tokyo (JP); Takashi Okagawa, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 91 days.

(21) Appl. No.: 10/300,805

(22) Filed: Nov. 21, 2002

(65) Prior Publication Data

US 2003/0216018 A1 Nov. 20, 2003

(30) Foreign Application Priority Data

May 17, 2002 (JP) ........................................ 2002-142802

(51) Int. Cl.[7] ..................... H01L 21/336; H01L 21/302
(52) U.S. Cl. ........................................ 438/197; 438/689
(58) Field of Search ................................. 438/197, 689

(56) References Cited

PUBLICATIONS

Hua–Yu Liu, et al. "The Application of Alternating Phase-shifting Masks to 140 nm Gate Patterning (II): Mask Design and Manufacturing Tolerances" SPIE vol. 3334, 1998, pp. 2–14.

*Primary Examiner*—Evan Pert
*Assistant Examiner*—Scott B. Geyer
(74) *Attorney, Agent, or Firm*—Oblon, Spivak, McClelland, Maier & Neustadt, P.C.

(57) ABSTRACT

The reduction of length of a gate electrode is suppressed in the process of thinning it. A hard mask (5a) is thinned and used to etch a gate electrode material film (4) to form a gate electrode. At this time, a resist mask (10) having an opening (11) over an active region (1) is formed; the resist mask (10) covers at least both ends in the length direction of the hard mask (5a) and exposes in the opening (11) at least the entirety of the part of the hard mask (5a) which lies right above the active region (1). The hard mask (5a) is thinned by etching using the resist mask (10) as a mask and therefore the hard mask (5a) is thinned in the part over the active region (1) without being shortened in the length direction. As a result, the gate electrode formed by using the thinned hard mask (5a) is not shortened in length.

11 Claims, 12 Drawing Sheets

METHOD OF MANUFACTURING A THINNED GATE ELECTRODE UTILIZING PROTECTIVE FILMS AND ETCHING

BACKGROUND OF THE INVENTION

1. Field of the Invention

The present invention relates to a semiconductor device having a gate electrode and its manufacturing method, and particularly to a technique for thinning the gate electrode.

2. Description of the Background Art

The requirements of making finer circuit patterns for more highly integrated semiconductor devices are constantly bringing about finer gate electrode structures. Also, the technique for reducing the gate length (channel length) of transistors, i.e. for thinning the gate electrode structures, is important for the purpose of increasing the speed of devices. However, since the resolution in lithography is limited by the limited wavelength of the light source, it is difficult to form gate electrodes having widths of about 100 nm or less by using common gate electrode formation process; therefore the methods shown below are used to form such thin gate electrodes.

Figure 22A:
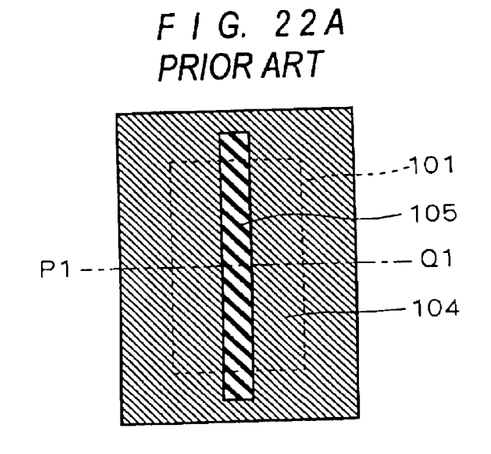
Figure 22B:
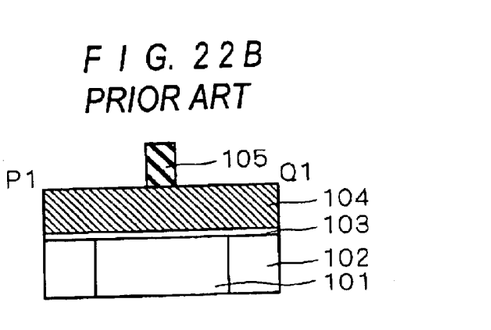
Figure 23A:
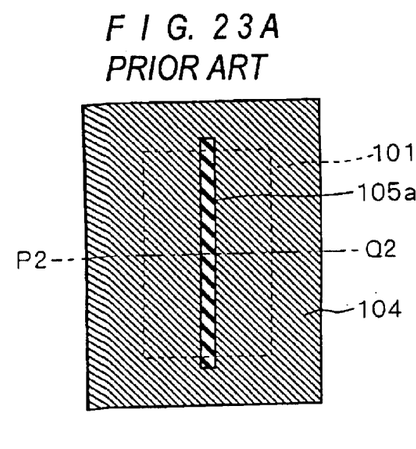
Figure 23B:
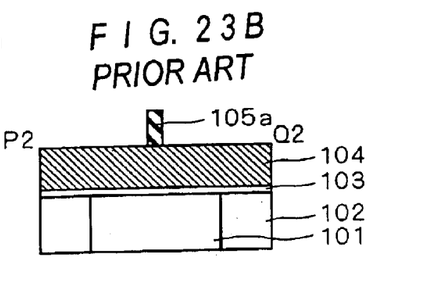
Figure 24A:
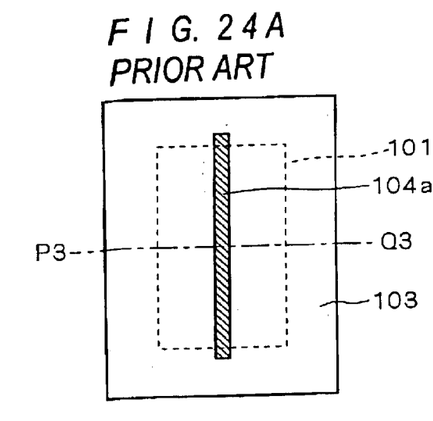
Figure 24B:
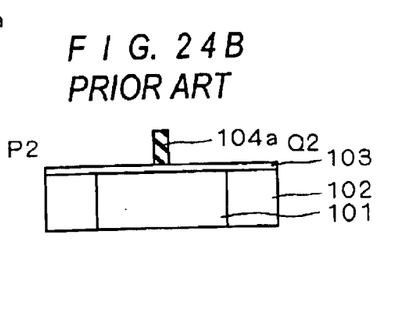

FIGS. 22A, 22B, 23A, 23B, 24A and 24B are process diagrams showing a conventional semiconductor device manufacturing method. In these drawings, FIG. 22B shows the cross section taken along the direction P1-Q1 in FIG. 22A, FIG. 23B shows the cross section taken along the direction P2-Q2 in FIG. 23A, and FIG. 24B shows the cross section taken along the direction P3-Q3 in FIG. 24A. First, as shown in FIGS. 22A and 22B, a gate oxide film 103 and a gate electrode material film 104 are formed on a silicon substrate having an active region 101 and isolation oxide films 102, and a resist mask 105, in the shape of a line crossing the active region 101, is formed thereon by lithography. Next, the resist mask 105 is lightly ashed and thus slimmed (thinned). This results in, as shown in FIGS. 23A and 23B, a resist mask 105a of a reduced width (hereinafter referred to as a thinned resist mask). Then the gate electrode material film 104 is anisotropically etched using the thinned resist mask 105a as a mask, so as to form a thinned gate electrode 104a as shown in FIGS. 24A and 24B.

Clearly, the gate electrode 104a thus obtained has a smaller width than the resist mask 105 shown in FIGS. 22A and 22B which was formed by lithography and which has not yet been thinned. This means that the width of the gate electrode 104a can be reduced beyond the limit of resolution in the lithography technique. As can be seen from FIGS. 24A and 24B, thinning the gate electrode and reducing its width shortens the gate length (channel length) of the transistor, which contributes to achievement of higher operation speed of the semiconductor device.

Figure 25A:
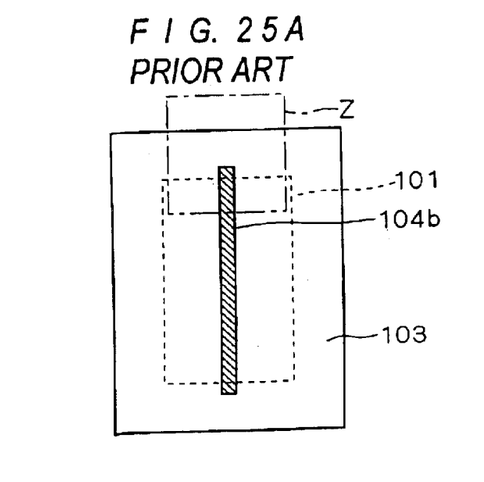
FIGS. 25A and 25B are diagrams used to describe a problem of the conventional semiconductor device.
Figure 25B:
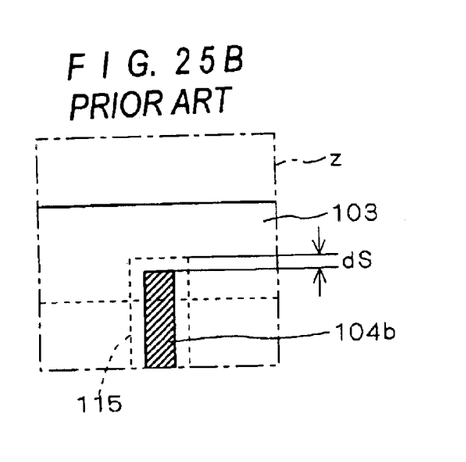

FIGS. 25A and 25B are diagrams used to describe a problem of this conventional semiconductor device. FIG. 25A is the top view of the semiconductor device having the thinned gate electrode 104a shown in FIG. 24A, and FIG. 25B is an enlarged view of the part Z in FIG. 25A, where the broken line 115 shows the shape of the resist mask 105 of FIG. 22A which are not yet thinned. The ashing process for thinning the resist mask 105 in this method reduces the entire dimensions of the resist mask 105. That is to say, the resist mask 105 is made smaller not only in the width direction but also in the length direction to form the thinned resist mask 105a. Accordingly, as shown in FIG. 25B, the length of the resultant gate electrode 104a is shorter by dS than the length of the resist mask 105 not thinned yet. As a countermeasure, it may be suggested that, prior to the process of thinning the gate electrode, a longer resist mask 105 be formed before it is thinned, considering the lengthwise size reduction. However, forming a longer resist mask 105 increases the chip size and therefore hinders achievement of higher integration of the semiconductor device.

Figure 26A:
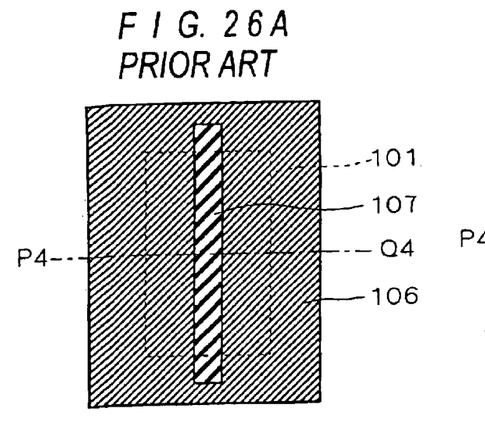
Figure 26B:
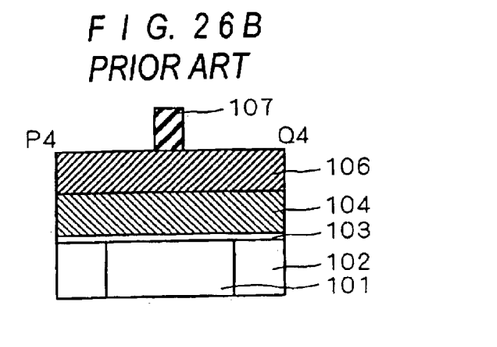
Figures 27A, 27B:
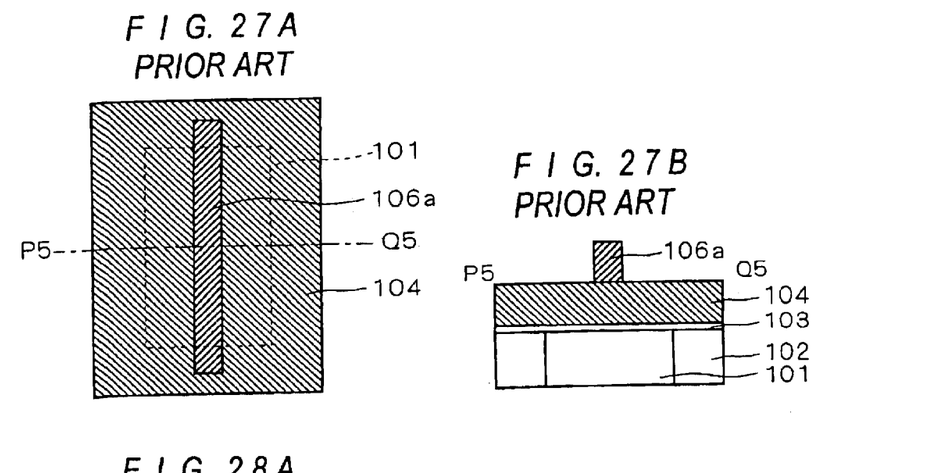
Figures 28A, 28B:
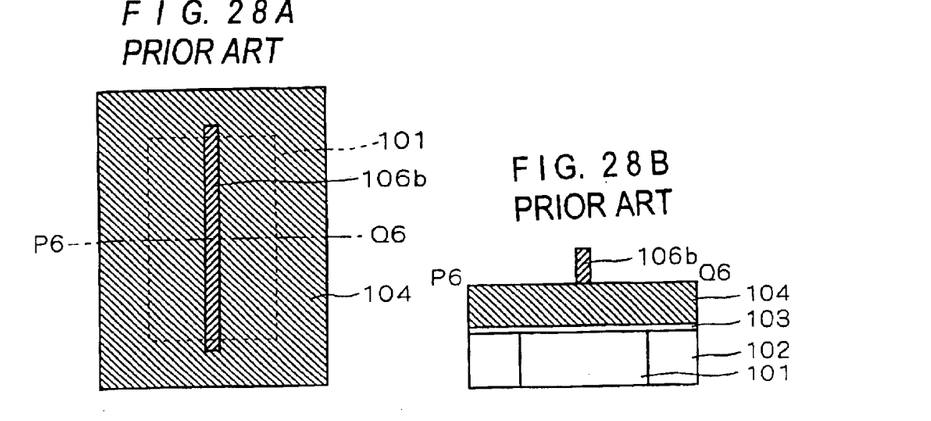
Figure 29A:
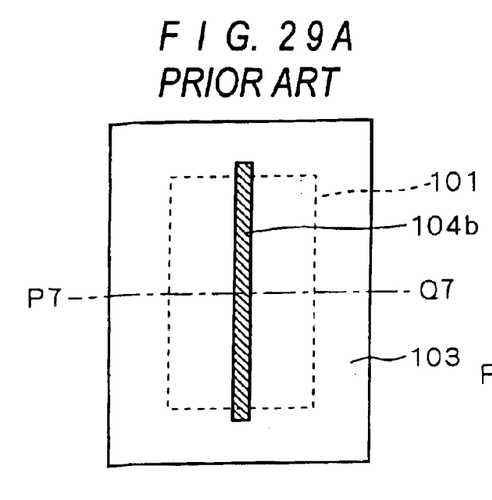
Figure 29B:
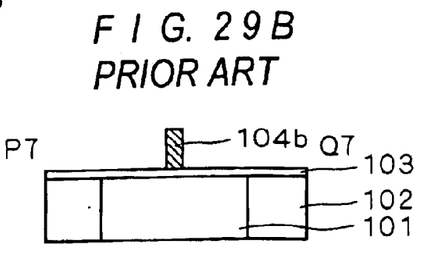

FIGS. 26A, 26B, 27A, 27B, 28A, 28B, 29A and 29B are process diagrams showing another conventional semiconductor device manufacturing method. In these drawings, FIG. 26B shows the cross section taken along the direction P4-Q4 in FIG. 26A, FIG. 27B shows the cross section taken along the direction P5-Q5 in FIG. 27A, and FIG. 28B shows the cross section taken along the direction P6-Q6 in FIG. 28A. FIG. 29B shows the cross section taken along the direction P7-Q7 in FIG. 29A. First, as shown in FIGS. 26A and 26B, a gate oxide film 103, a gate electrode material film 104, and a hard mask material film 106 of, e.g. $SiO_2$, are formed on a silicon substrate having an active region 101 and isolation oxide films 102, and a resist mask 107 in the shape of a line crossing the active region 101 is formed thereon by lithography. Then the hard mask material film 106 is etched by using the resist mask 107 as a mask to form a hard mask 106a as shown in FIGS. 27A and 27B. Next, the hard mask 106a is thinned by isotropic etching, e.g. wet etching. This results in a hard mask 106b of a reduced width (hereinafter referred to as a thinned hard mask) as shown in FIGS. 28A and 28B. Then the gate electrode material film 104 is anisotropically etched using the thinned hard mask 106b as a mask, so as to form a thinned gate electrode 104b as shown in FIGS. 29A and 29B.

The process of thinning the hard mask 106a in this method provides the thinned hard mask 106b which has been made smaller not only in the width direction but also in the length direction than the hard mask 106a not thinned yet. That is to say, the resultant gate electrode 104b, too, is shorter in length than the hard mask 106a not thinned yet. That is, this manufacturing method, too, raises the problem described referring to FIGS. 25A and 25B.

As described above, the gate electrode thinning techniques in the conventional semiconductor device manufacturing methods involve a reduction of the length of the gate electrode. This requires that the gate electrode be designed longer in advance, considering the reduction of length (i.e. in the processes shown above, forming a longer resist mask 105 (or 107) before it is thinned), or that larger pads be designed at both ends of the gate electrode to which interconnections are connected, but such approaches result in an increase in chip size.

SUMMARY OF THE INVENTION

An object of the invention is to provide a semiconductor device and a manufacturing method thereof in which the reduction of length of the gate electrode can be suppressed when it is thinned.

According to a first aspect of the invention, a semiconductor device manufacturing method includes the following steps (a) to (e) of: (a) forming a gate insulating film on a semiconductor substrate having an active region formed in its surface and forming a gate electrode material film on the gate insulating film; (b) forming on the gate electrode material film a first protective film in the shape of a line crossing the active region; (c) forming a second protective film which covers at least both ends in the length direction of the first protective film and which leaves uncovered at least the part of the first protective film which lies right above the active region; (d) thinning the first protective film using the second protective film as a mask; and (e) etching the gate electrode material film using the thinned first protective film as a mask, so as to form a gate electrode.

In the step (d), the second protective film used as a mask prevents the first protective film from being shortened in the length direction. As a result the gate electrode formed in the step (e) is not shortened, either, and therefore it is not necessary to size the first resist mask longer prior to the thinning process, which contributes to achievement of higher integration of the semiconductor device. On the other hand, the part of the gate electrode which lies on the active region is thinned and therefore the gate length (channel length) is shortened, which contributes to achievement of higher operation speed of the semiconductor device.

According to a second aspect of the invention, a semiconductor device manufacturing method includes the following steps (a) to (e) of: (a) forming a gate insulating film on a semiconductor substrate having an active region formed in its surface and forming a gate electrode material film on the gate insulating film; (b) forming on the gate electrode material film a first protective film in the shape of a line crossing the active region; (c) etching the gate electrode material film using the first protective film as a mask to form a gate electrode; (d) forming a second protective film which covers at least both ends in the length direction of the gate electrode and which leaves uncovered at least the part of the gate electrode which lies on the active region; and (e) thinning the gate electrode by etching using the second protective film as a mask.

In the step (e), the second protective film used as a mask prevents the gate electrode from being shortened in the length direction. As a result it is not necessary to size the first protective film longer prior to the thinning process, which contributes to achievement of higher integration of the semiconductor device. On the other hand, the part of the gate electrode which lies on the active region is thinned and therefore the gate length (channel length) is shortened, which contributes to achievement of higher operation speed of the semiconductor device.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 1A and 1B to 7A, 7B and 7C are process diagrams used to describe a semiconductor device manufacturing method according to a first preferred embodiment;

FIGS. 11A and 11B to 13A and 13B are process diagrams used to describe a semiconductor device manufacturing method according to a third preferred embodiment;

FIGS. 15A and 15B to 18A, 18B and 18C are process diagrams used to describe a semiconductor device manufacturing method according to a fourth preferred embodiment;

FIGS. 22A and 22B to 24A and 24B are process diagrams showing a conventional semiconductor device manufacturing method;

FIGS. 26A and 26B to 29A and 29B are process diagrams showing a conventional semiconductor device manufacturing method.

DESCRIPTION OF THE PREFERRED EMBODIMENTS

<First Preferred Embodiment>

Figure 1A:
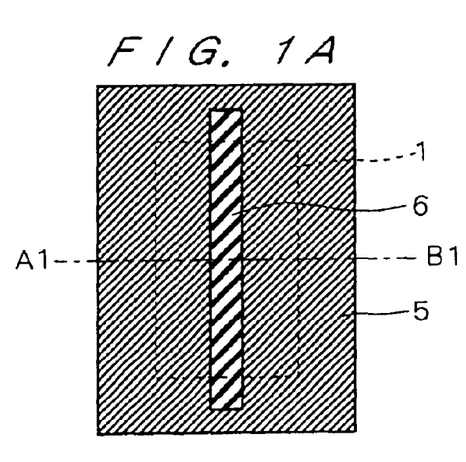
Figure 1B:
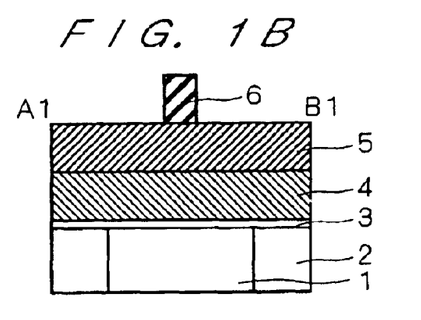
Figure 2A:
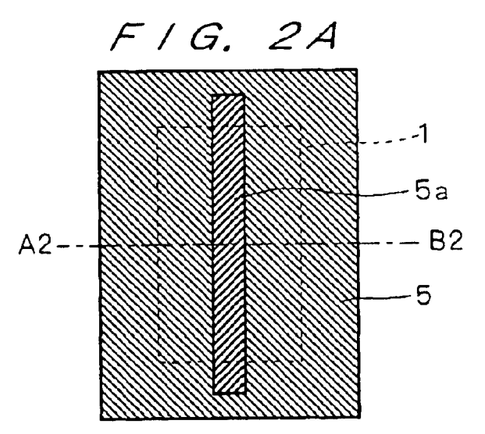
Figure 2B:
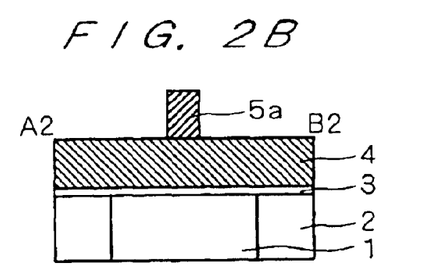
Figure 4A:
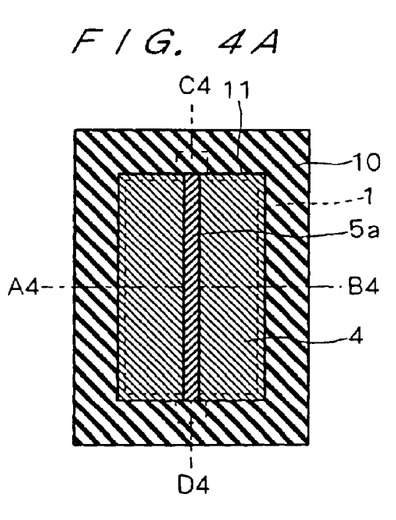
Figure 4B:
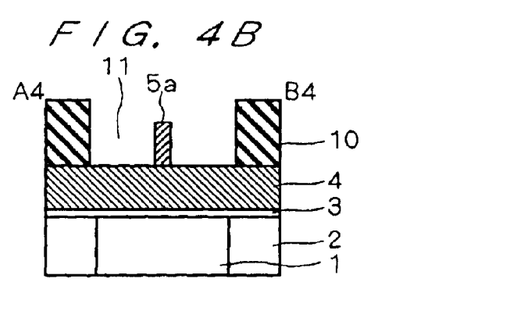
Figure 4C:
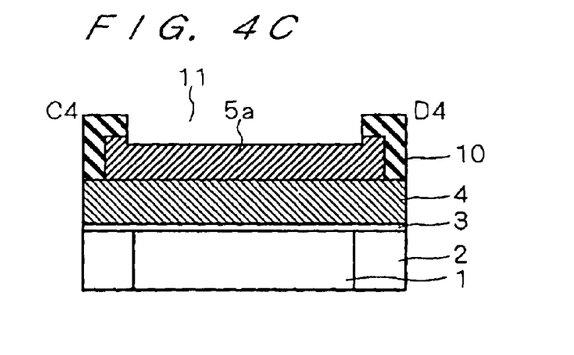
Figure 5A:
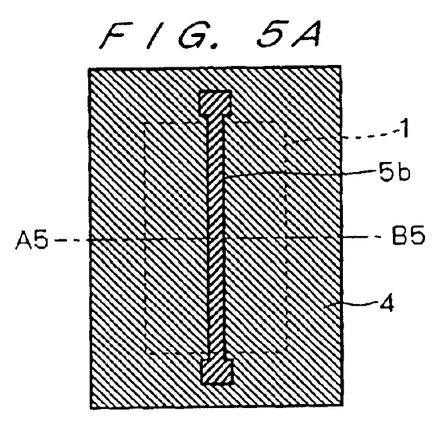
Figure 5B:
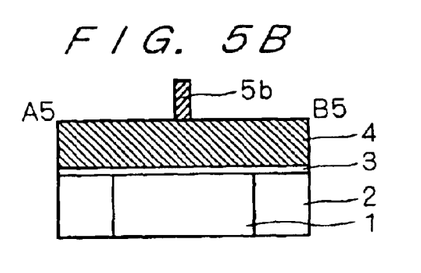
Figure 6A:
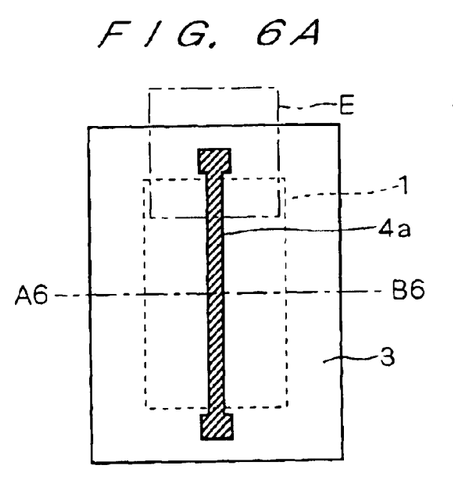
Figure 6B:
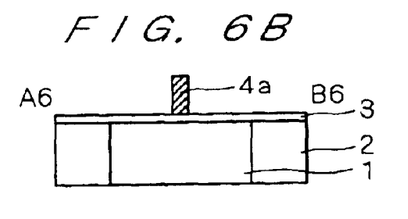
Figure 6C:
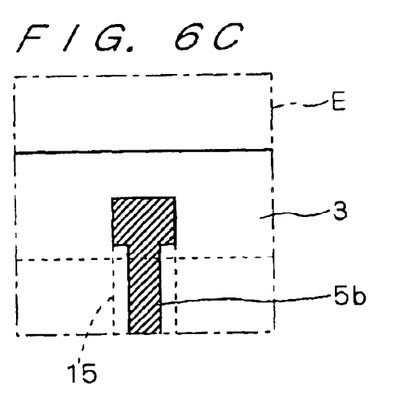

FIGS. 1A, 1B, 2A, 2B, 3A, 3B, 3C, 4A, 4B, 4C, 5A, 5B, 6A, 6B and 6C are process diagrams showing a semiconductor device manufacturing method according to a first preferred embodiment. In these diagrams, FIG. 1B shows the cross section taken along the direction A1-B1 in FIG. 1A, FIG. 2B shows the cross section taken along the direction A2-B2 in FIG. 2A, FIGS. 3B and 3C show the cross sections taken along the directions A3-B3 and C3-D3 in FIG. 3A, respectively, FIGS. 4B and 4C show the cross sections taken along the directions A4-B4 and C4-D4 in FIG. 4A, respectively, FIG. 5B shows the cross section taken along the direction A5-B5 in FIG. 5A, FIG. 6B shows the cross section taken along the direction A6-B6 in FIG. 6A, and FIG. 6C is an enlarged view of the part E in FIG. 6A. The semiconductor device manufacturing method of this preferred embodiment is now described referring to these drawings.

First, as shown in FIGS. 1A and 1B, a gate oxide film 3, a gate electrode material film 4, and a hard mask material film 5, e.g. TEOS oxide film or silicon nitride film, are formed on a silicon substrate having an active region 1 and isolation oxide films 2, and a first resist mask 6, in the shape of a line crossing the active region 1, is formed thereon by lithography. Then the hard mask material film 5 is etched using the first resist mask 6 as a mask and then the first resist mask 6 is removed to obtain a hard mask 5a, or a first protective film, as shown in FIGS. 2A and 2B.

Figure 3A:
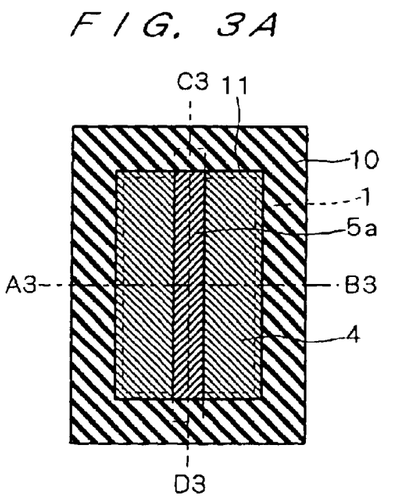
Figure 3B:
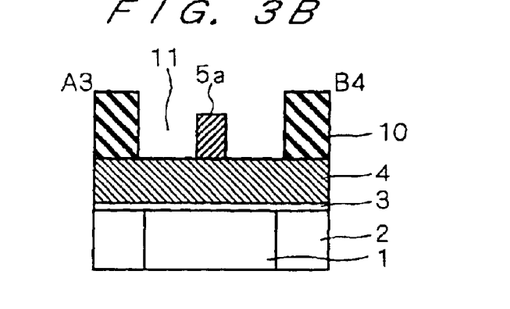
Figure 3C:
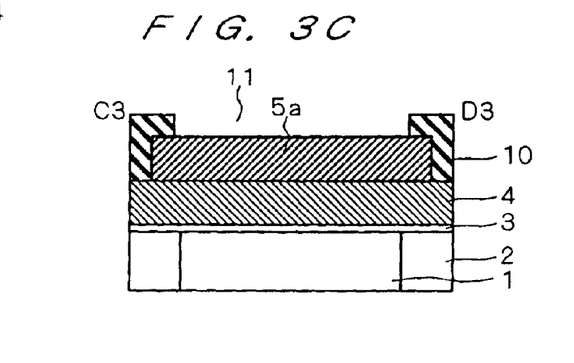

Subsequently, as shown in FIGS. 3A to 3C, a second resist mask 10, or a second protective film, having an opening 11 right above the active region 1 is formed by lithography. At this time, as shown in FIGS. 3A and 3C, the second resist mask 10 is formed so that it covers at least both ends, in the length direction, of the hard mask 5a, and so that it leaves uncovered at least the entirety of the part of the hard mask 5a which lies right above the active region 1 (so that at least the part of the hard mask 5a that lies right above the active region 1 is entirely exposed in the opening 11). Considering alignment error in formation of the opening 11, it is desirable to size the opening 11 somewhat larger than the width of the active region 1 so that the part of the hard mask 5a right above the active region 1 can certainly be exposed entirely. However, note that care should be taken so that both ends of the hard mask 5a are not exposed in the opening 11.

Next, the surface of the hard mask 5a is etched and thinned by isotropic etching, e.g. wet etching, using the second resist mask 10 as a mask. As a result, as shown in FIGS. 4A to 4C, the sides and top surface of the hard mask 5a, which are exposed in the opening 11, are etched. During this process, both ends in the length direction of the hard mask 5a, covered by the second resist mask 10, are not etched. Then, the second resist mask 10 is removed by ashing, and as shown in FIGS. 5A and 5B, a hard mask 5b is obtained which has been thinned only in the part located right over the active region 1.

In the description below, a resist mask, a hard mask, and a gate electrode obtained as a result of the thinning process, which are thinner than the first resist mask 6 not thinned, are referred to as "a thinned resist mask," "a thinned hard mask," and "a thinned gate electrode."

Subsequently, the gate electrode material film 4 is anisotropically etched using the thinned hard mask 5b as a mask and then the thinned hard mask 5b is removed to obtain a thinned gate electrode 4a that is thinned only in the part that is on the active region 1 as shown in FIGS. 6A to 6C. Now, the broken line 15 in FIG. 6C shows the shape of the resist mask 6 shown in FIG. 1A which are not thinned yet. In this preferred embodiment, the etching process for thinning the hard mask 5a is performed by using the second resist mask 10 as a mask, so that both ends of the hard mask 5a are not etched. That is to say, the length of the resultant thinned hard mask 5b is not shortened from the length of the hard mask 5a not thinned yet. Therefore the thinned gate electrode 4a obtained by etching using the thinned hard mask 5b is not shortened in the length direction, either, as shown in FIG. 6C.

The thinned hard mask 5b is removed by a different method depending on its material. For example, when TEOS oxide film is used as the material of the thinned hard mask 5b, etching the hard mask 5b away after the etching for forming the thinned gate electrode 4a may unnecessarily etch the gate oxide film 3 and the isolation oxide films 2 because of a small etch selectivity ratio. Accordingly, in this case, it is desirable to previously adjust the film thickness of the thinned hard mask 5b so that the TEOS oxide film, i.e. the thinned hard mask 5b, will be removed simultaneously by the etching for forming the thinned gate electrode 4a. When silicon nitride film is used as the hard mask, it may be removed by this method, or it may be removed, after the etching for forming the thinned gate electrode 4a, by an etching process exhibiting a high etch selectivity ratio between nitride film and oxide film. Needless to say, if the device structure allows the thinned hard mask 5b to remain on the thinned gate electrode 4a, the thinned hard mask 5b does not necessarily have to be removed.

As shown in FIGS. 6A to 6C, the semiconductor device of this preferred embodiment, formed by the process above, has the thinned gate electrode 4a that is thinned only in the part on the active region 1. That is to say, in the thinned gate electrode 4a, the width of the whole part located right on the active region is smaller than the width of both its ends in the length direction. That is to say, the part of the thinned gate electrode 4a located on the active region 1 is thinned and therefore the gate length (channel length) of the transistor is shortened, which contributes to achievement of higher operation speed of the semiconductor device. On the other hand, as can be understood from the process described above, the length of the thinned gate electrode 4a is not shortened from the length of the first resist mask 6 and therefore it is not necessary to previously form the first resist mask 6 longer, which contributes to achievement of higher integration of the semiconductor device. While the width of both ends of the thinned gate electrode 4a, which are located outside the active region 1, remains unthinned, the width of these parts is clearly not related to the gate length and therefore does not hinder the achievement of higher operation speed of the device.

As for the material of the thinned gate electrode 4a in this preferred embodiment, Poly-Si or any other gate electrode materials, such as metal materials like W, are applicable. The first resist mask 6, the second resist mask 10, etc. can be formed by any lithography techniques using electron-beam exposure, X-ray exposure, etc., as well as optical exposure.

Figure 7A:
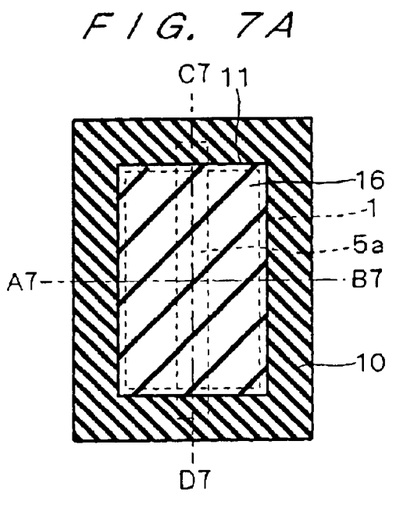
Figure 7B:
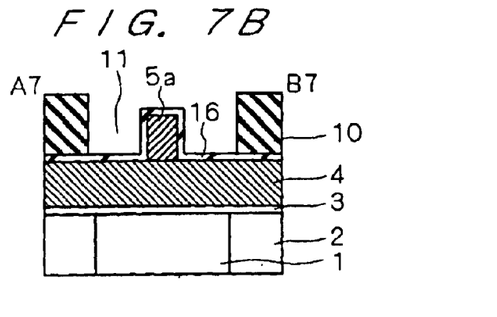
Figure 7C:
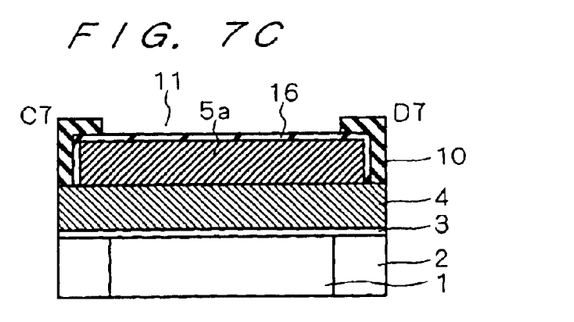

Further, prior to the formation of the second resist mask 10, an antireflection agent may be applied to or formed as a film on the underlayer in order to suppress reflection from the underlayer during the exposure for forming the opening 11 in the second resist mask 10 over the active region. FIGS. 7A to 7C are diagrams that show the structure obtained in this case immediately after the formation of the opening 11. FIGS. 7B and 7C show the cross sections taken along the directions A7-B7 and C7-D7 of FIG. 7A, respectively. As shown in these diagrams, immediately after the opening 11 has been formed, the hard mask 5a in the opening 11 is covered by an antireflection coating 16. Accordingly, in this case, before thinning the hard mask 5a, the antireflection coating 16 in the opening 11 is first removed by, e.g. ashing, to expose the hard mask 5a, and subsequently the exposed hard mask 5a is thinned by etching.

In this preferred embodiment, as shown in FIGS. 3A to 3C, the second resist mask 10 has a rectangular opening 11 which opens entirely over the active region 1 in plan view. However, the second resist mask 10 may be arbitrarily shaped as long as it at least covers both ends in the length direction of the hard mask 5a and it at least leaves uncovered the entirety of the part of the hard mask 5a that is right above the active region 1. In other words, the effect of this preferred embodiment can be obtained when the second resist mask 10 is formed to cover the part of the gate electrode where dimension reduction should be prevented (i.e. the part not to be thinned) and not to cover the part to be thinned.

When a plurality of devices having gate electrodes are formed on a semiconductor substrate, the devices may include those which require thinning the gate electrode to shorten the gate length and those which require keeping the gate electrode unthinned and hence the gate length unchanged. In such a case, the second resist mask 10 is formed to also cover the gate electrodes of the latter devices, i.e. those which do not require thinning the gate electrode. Also, desirably, the second resist mask 10 is formed to cover the regions where interconnections among the devices are formed, since they do not require thinning.

<Second Preferred Embodiment>

In the first preferred embodiment, TEOS oxide film or silicon nitride film is used as the material of the hard mask used to form the thinned gate electrode; in this preferred embodiment, an organic compound, such as SiC, SiOC, or amorphous carbon, is used as the material of the hard mask. Hard masks made of such organic compounds can be removed by ashing.

Figure 8A:
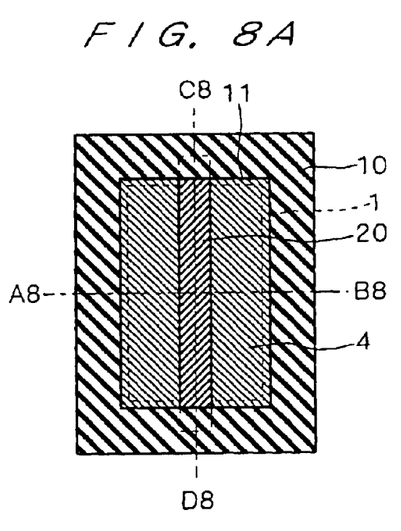
FIGS. 8A, 8B, 8C, 9A and 9B are process diagrams used to describe a semiconductor device manufacturing method according to a second preferred embodiment.
Figure 8B:
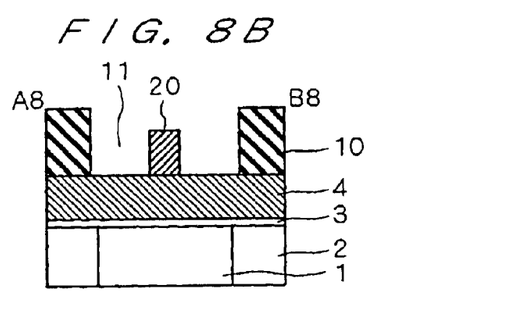
Figure 8C:
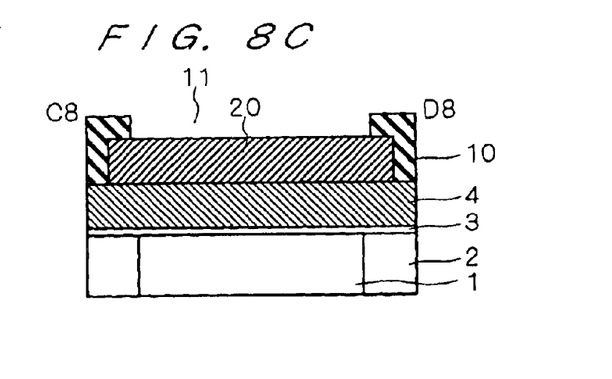
Figure 9A:
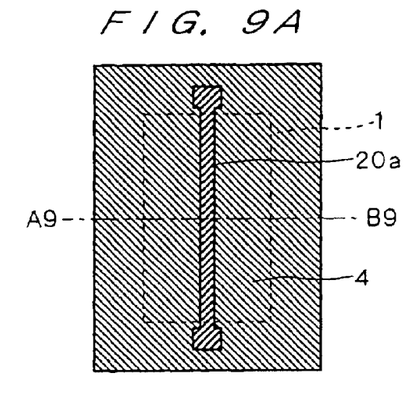
Figure 9B:
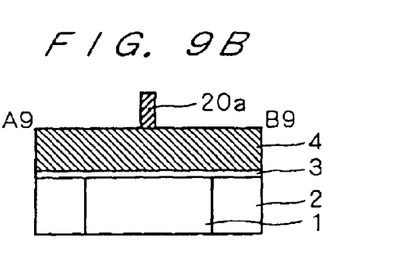

FIGS. 8A, 8B, 8C, 9A and 9B are process diagrams used to explain a semiconductor device manufacturing method of the second preferred embodiment. In these diagrams, FIGS. 8B and 8C show the cross sections taken along the directions A8-B8 and C8-D8 in FIG. 8A, respectively, and FIG. 9B shows the cross section taken along the direction A9-B9 in FIG. 9A. The semiconductor device manufacturing method of this preferred embodiment is now described referring to these diagrams.

First, by the same processes described in the first preferred embodiment, the gate oxide film 3 and the gate electrode material film 4 are formed on a silicon substrate having the active region 1 and the isolation oxide films 2. Then, as shown in FIGS. 8A to 8C, a hard mask 20 of an organic compound in the shape of a line crossing the active region 1, i.e. the first protective film, is formed thereon and the second resist mask 10 having the opening 11 above the active region 1, i.e. the second protective film, is formed. As in the first preferred embodiment, the second resist mask 10 is formed to cover at least both ends of the hard mask 5a in the length direction and to leave uncovered at least the entirety of the part of the hard mask 20 which lies right above the active region 1. Note that, in this preferred embodiment, the second resist mask 10 is made of a material which exhibits a higher ashing rate than the organic-compound hard mask 20 and offers a high selectivity with respect to the hard mask 20 during ashing.

Resist materials which satisfy these conditions with respect to the hard mask of organic compound such as SiC, SiOC, or amorphous carbon, include resists for KrF excimer laser, of acetal, t-BOC (tertiary Butoxy Carbonyl), and ESCAP based, and resists for ArF excimer laser, of acrylic, polynorbornene, and COMA (Cyclo-Olefin Maleic Anhydride) classes, for example. Common resists for F2 laser or EB laser also provide selectivity with respect to the hard mask during ashing.

Next, isotropic ashing process is performed using the second resist mask 10 as a mask to thin the hard mask 20. The second resist mask 10 is removed by the ashing since the material of the second resist mask 10 exhibits a higher ashing rate than the hard mask 20. In other words, the second resist mask 10 having a higher ashing rate is completely removed by the ashing, while the hard mask 20 having a slower ashing rate is removed only in the surface portion and is thus thinned. That is to say, the ashing process achieves the thinning of the hard mask 20 and the removal of the second resist mask 10 at the same time. On the other hand, during this process, both ends of the hard mask 20 are not ashed and therefore remain unthinned until the second resist mask 10 covering these parts has been completely removed. As a result, after the second resist mask 10 has been removed by the ashing, as shown in FIG. 9A, a thinned hard mask 20a of organic compound is obtained which is thinned only in the part above the active region 1.

Subsequently, the gate electrode material film 4 is anisotropically etched by using the thinned hard mask 20a as a mask and then the thinned hard mask 20a is removed, so as to obtain, as in the first preferred embodiment, a thinned gate electrode 4a as shown in FIGS. 6A to 6C in which only the part residing on the active region 1 is thinned. In this preferred embodiment, during the ashing process for thinning the hard mask 20, both of its ends are not ashed because they are covered by the second resist mask 10. That is to say, the resultant thinned hard mask 20a is not shortened in the length direction from the length of the hard mask 20 not thinned yet. Accordingly, the thinned gate electrode 4a obtained by etching using the thinned hard mask 20a as a mask is not shortened in the length direction, either, as shown in FIG. 6C.

Now, as for the removal of the thinned organic-compound hard mask 20a, it may be removed by ashing after the thinned gate electrode 4a has been formed by etching, or the film thickness of the thinned hard mask 20a may be previously adjusted so that the thinned hard mask 20a can also be removed by the etching for formation of the thinned gate electrode 4a. Needless to say, if the device structure allows the thinned hard mask 20a to remain on the thinned gate electrode 4a, the thinned hard mask 20a does not necessarily have to be removed.

As shown above, in the semiconductor device of this preferred embodiment, as in the first preferred embodiment, the part of the thinned gate electrode 4 that lies on the active region 1 is thinned and so the gate length (channel length) of the transistor is shortened, which contributes to achievement of higher operation speed of the semiconductor device. Furthermore, as can be understood from the process described above, the length of the thinned gate electrode 4a is not shortened from the length of the first resist mask 6, which contributes to achievement of higher integration of the semiconductor device.

Moreover, in the semiconductor device manufacturing method of this preferred embodiment, as shown above, the thinning of the organic-compound hard mask 20 and the removal of the second resist mask 10 can be achieved by a single ashing process, and the manufacturing process is thus simpler than that of the first preferred embodiment.

Also in this preferred embodiment, the first resist mask 6, the second resist mask 10, etc. can be formed by any lithography techniques using electron-beam exposure, X-ray exposure, etc., as well as optical exposure.

Figure 10A:
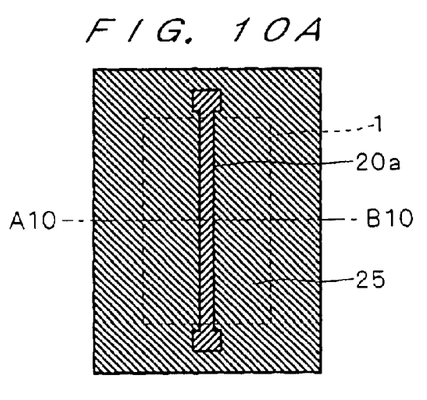
FIGS. 10A and 10B are diagrams used to describe a modification of the second preferred embodiment.
Figure 10B:
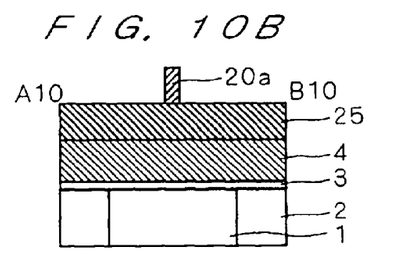

Also in this preferred embodiment, the thinned gate electrode 4a may be made of Poly-Si or any other gate electrode materials, such as metal materials like W. However, if a sufficient etch selectivity ratio cannot be obtained between the organic-compound hard mask and the gate electrode material, the following modification will work. FIGS. 10A and 10B are diagrams used to describe a modification of the second preferred embodiment, where FIG. 10B shows the cross section taken along the direction A10-B10 in FIG. 10A. That is to say, in the manufacturing process of this preferred embodiment, a TEOS oxide film is previously formed between the gate electrode material film 4 and the organic-compound hard mask material film. As a result, after the hard mask 20 has been thinned, as shown in FIGS. 10A and 10B, a TEOS oxide film 25 resides on the gate electrode material film 4 and the thinned hard mask 20a resides thereon. First, the TEOS oxide film 25 is patterned by etching using the thinned hard mask 20a as a mask and then the thinned gate electrode 4a is patterned by using the patterned TEOS oxide film 25. Thus, this preferred embodiment can be applied also to gate electrode materials which cannot offer sufficient etch selectivity ratio with respect to the hard mask of organic compound.

Furthermore, in this preferred embodiment, before the formation of the second resist mask 10, an antireflection agent may be applied to or formed as a film on the underlayer in order to suppress reflection from the underlayer during the exposure for forming the opening 11 in the second resist mask 10 over the active region. In this case, as has been described in the first preferred embodiment, the antireflection coating 16 in the opening 11 is first removed to expose the hard mask 20, and then ashing is applied to thin the hard mask 20 and to remove the second resist mask 10.

<Third Preferred Embodiment>

Figure 11A:
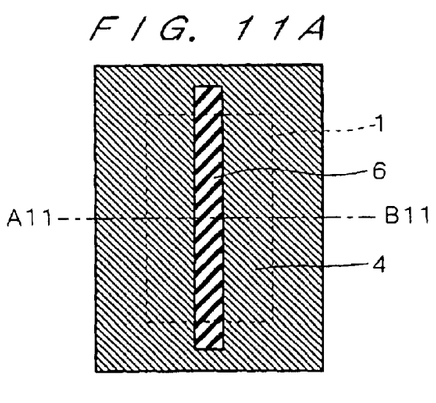
Figure 11B:
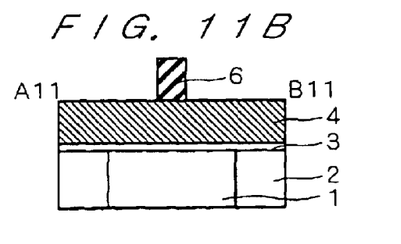
Figure 12A:
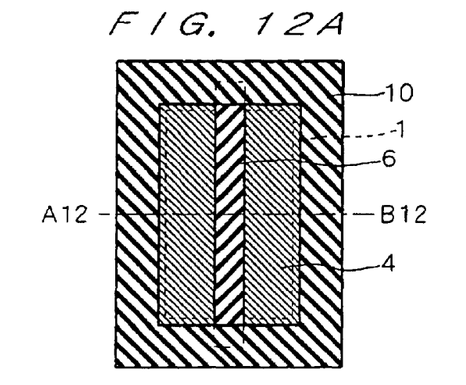
Figure 12B:
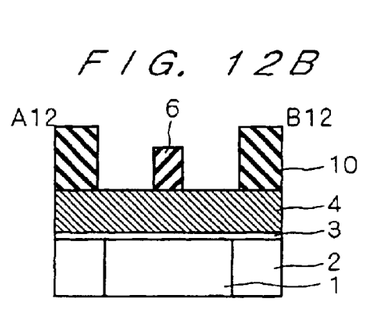
Figure 13A:
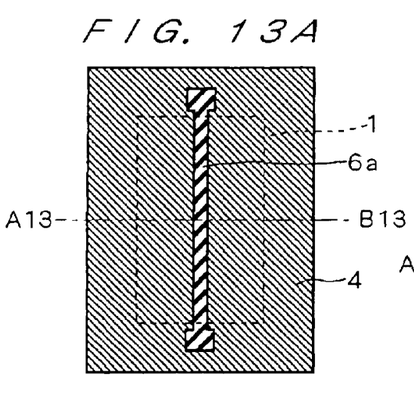
Figure 13B:
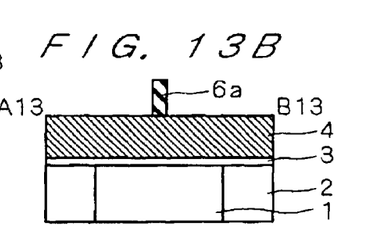

FIGS. 11A, 11B, 12A, 12B, 13A and 13B are process diagrams used to explain a semiconductor device manufacturing method according to a third preferred embodiment. In these diagrams, FIG. 11B shows the cross section taken along the direction A11-B11 in FIG. 11A, FIG. 12B shows the cross section taken along the direction A12-B12 in FIG. 12A, and FIG. 13B shows the cross section taken along the direction A13-B13 in FIG. 13A. The semiconductor device manufacturing method of this preferred embodiment is now described referring to these diagrams.

First, as shown in FIGS. 1A and 1B, the gate oxide film 3 and the gate electrode material film 4 are formed on the silicon substrate having the active region 1 and the isolation oxide films 2, and the first resist mask 6 in the shape of a line crossing the active region 1, i.e. the first protective film, is formed thereon by lithography. Then the first resist mask 6 undergoes a resist curing process with electron-beam radiation, ultraviolet (UV) radiation, ion implantation, etc.

Subsequently, as shown in FIGS. 12A and 12B, the second resist mask 10 having an opening 11 over the active region 1, i.e. the second protective film, is formed by lithography. The second resist mask 10 is formed to cover at least both ends in the length direction of the first resist mask 6, and to leave uncovered at least the entirety of the part of the first resist mask 6 which extends right above the active region 1. Considering alignment error in the formation of the opening 1, it is desirable to size the opening 11 somewhat larger than the width of the active region 1 so that it certainly contains the entirety of the part of the first resist mask 6 right above the active region 1. Note that care should be taken so that both ends of the first resist mask 6 are not exposed in the opening 11.

Next, the first resist mask 6 is thinned by isotropic ashing using the second resist mask 10 as a mask. In this preferred embodiment, the first resist mask 6 is cured as mentioned before and therefore the second resist mask 10 exhibits a higher ashing rate than the first resist mask 6, so that the second resist mask 10 is removed by this ashing process. In other words, the second resist mask 10 having a higher ashing rate is completely removed by this ashing process, while the first resist mask 6 having a lower ashing rate is removed only in the surface portion and is thus thinned. That is to say, this ashing process simultaneously achieves the thinning of the first resist mask 6 and the removal of the second resist mask 10. Also, during this process, both ends of the first resist mask 6 are not ashed and therefore remain unthinned until the second resist mask 10 covering these portions has been completely removed. As a result, after the second resist mask 10 has been removed by the ashing, as shown in FIG. 13A, the first resist mask 6a (thinned resist mask 6a) is obtained in which only the part over the active region 1 is thinned.

Subsequently, the gate electrode material film 4 is anisotropically etched by using the thinned resist mask 6a as a mask and then the thinned resist mask 6a is removed, so as to obtain, as in the first preferred embodiment, the thinned gate electrode 4a that is thinned only in the part on the active region 1 as shown in FIGS. 6A to 6C. In this preferred embodiment, during the ashing process for thinning the first resist mask 6, both its ends are not ashed because they are covered by the second resist mask 10. That is to say, the resultant thinned resist mask 6a is not shortened in the length direction from the length of the first resist mask 6 not thinned yet. Accordingly, the thinned gate electrode 4a obtained by etching using the thinned resist mask 6a as a mask is not shortened in the length direction, either, as shown in FIG. 6C.

As shown above, in the semiconductor device of this preferred embodiment, as in the first preferred embodiment, the part of the thinned gate electrode 4 which resides on the active region 1 is thinned and so the gate length (channel length) of the transistor is shortened, which contributes to achievement of higher operation speed of the semiconductor device. Furthermore, as can be understood from the process described above, during the process of forming the thinned gate electrode 4a, it is not shortened from the length of the first resist mask 6, which contributes to achievement of higher integration of the semiconductor device.

Also in this preferred embodiment, the formation of the first resist mask 6, the second resist mask 10, etc. can use any lithography techniques using electron-beam exposure, X-ray exposure, etc., as well as optical exposure.

Figure 14A:
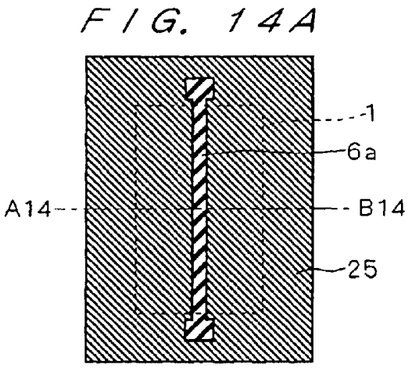
FIGS. 14A and 14B are diagrams used to describe a modification of the third preferred embodiment.
Figure 14B:
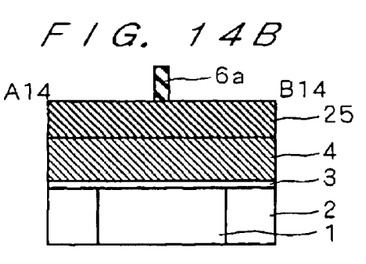

Also in this preferred embodiment, the thinned gate electrode 4a may be made of Poly-Si or any other gate electrode materials such as metal materials like W. However, if a sufficient etch selectivity ratio cannot be obtained between the resist mask and the gate electrode material, the following modification will work. FIGS. 14A and 14B are diagrams used to describe a modification of the third preferred embodiment, where FIG. 14B shows the cross section taken along the direction A14-B14 in FIG. 14A. That is to say, in the manufacturing process of this preferred embodiment, a TEOS oxide film is previously formed between the gate electrode material film 4 and the first resist mask 6. As a result, after the first resist mask 6 has been thinned, as shown in FIGS. 14A and 14B, the TEOS oxide film 25 resides on the gate electrode material film 4 and the thinned resist mask 6a resides thereon. During the formation of the thinned gate electrode 4a, first, the TEOS oxide film 25 is patterned by etching using the thinned resist mask 6a as a mask and then the thinned gate electrode 4a is patterned by using the patterned TEOS oxide film 25. Thus, this preferred embodiment can be applied also to gate electrode materials which cannot offer sufficient etch selectivity ratio with respect to the resist mask.

<Fourth Preferred Embodiment>

Figure 15A:
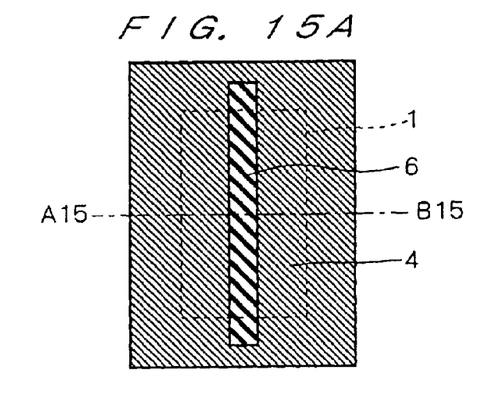
Figure 15B:
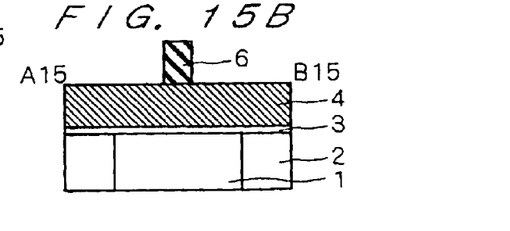
Figure 16A:
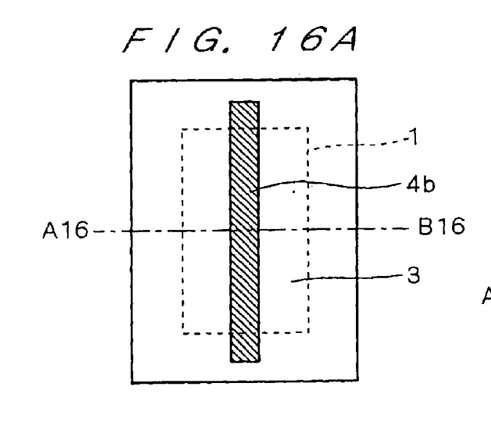
Figure 16B:
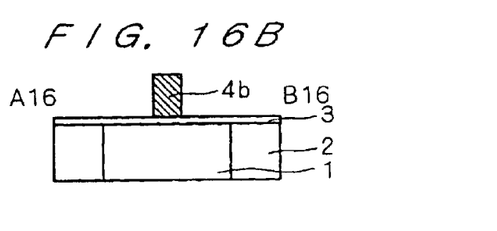
Figures 17A, 17B:
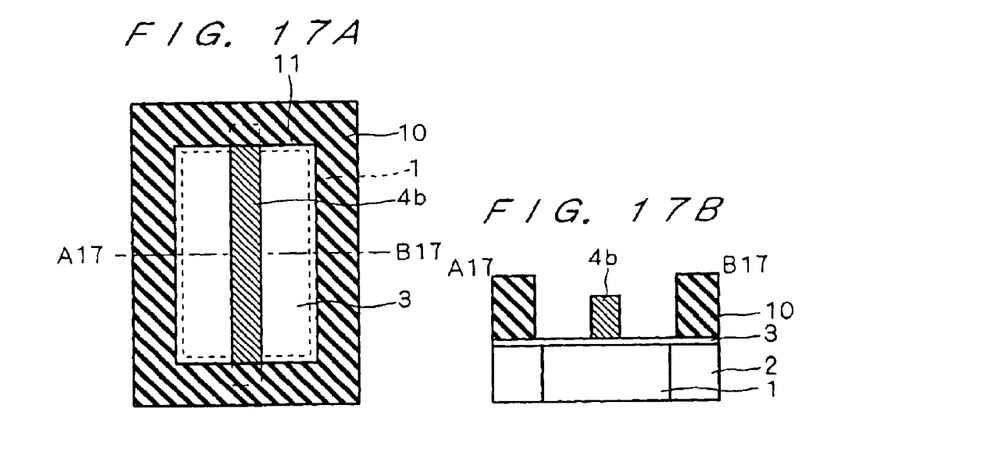
Figure 18A:
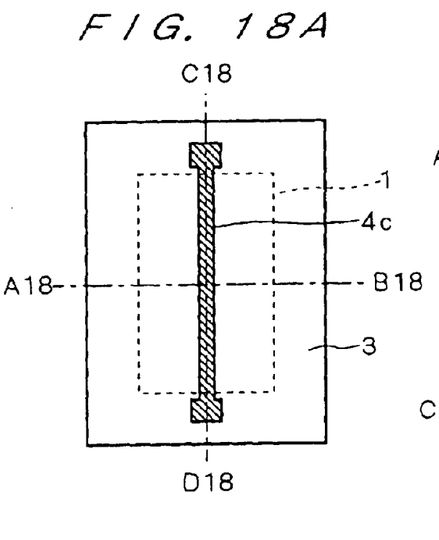
Figure 18B:
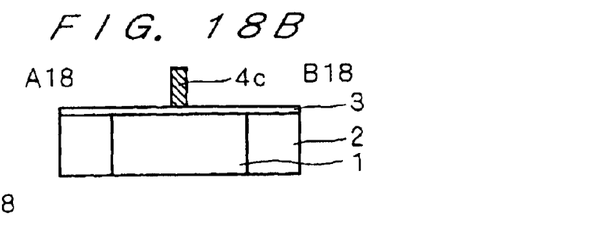
Figure 18C:
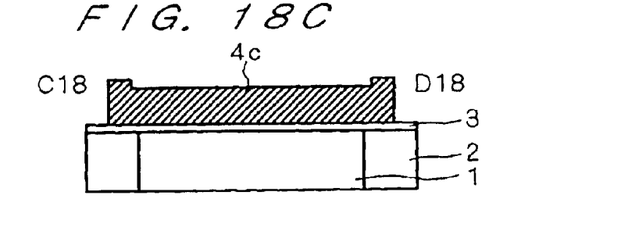

FIGS. 15A, 15B, 16A, 16B, 17A, 17B, 18A, 18B and 18C are process diagrams used to explain a semiconductor device manufacturing method according to a fourth preferred embodiment. In these diagrams, FIG. 15B shows the cross section taken along the direction A15-B15 in FIG. 15A, FIG. 16B shows the cross section taken along the direction A16-B16 in FIG. 16A, FIG. 17B shows the cross section taken along the direction A17-B17 in FIG. 17A, and FIGS. 18B and 18C show the cross sections taken along the directions A18-B18 and C18-D18 in FIG. 18A, respectively. The semiconductor device manufacturing method of this preferred embodiment is now described referring to these diagrams.

First, as shown in FIGS. 15A and 15B, the gate oxide film 3 and the gate electrode material film 4 are formed on the silicon substrate having the active region 1 and the isolation oxide films 2, and the first resist mask 6 in the shape of a line crossing the active region 1, i.e. the first protective film, is formed thereon by lithography. Then, in this preferred embodiment, without thinning the first resist mask 6, the gate electrode material film 4 is anisotropically etched by using the first resist mask 6 as a mask to form a gate electrode 4b as shown in FIGS. 16A and 16B.

Subsequently, as shown in FIGS. 17A and 17B, the second resist mask 10 having the opening 11 above the active region 1, i.e. the second protective film, is formed by lithography. The second resist mask 10 is formed to cover at least both ends in the length direction of the gate electrode 4b, and to leave uncovered at least the entirety of the part of the gate electrode 4b which lies right on the active region 1. Considering alignment error in the formation of the opening 11, it is desirable to size the opening 11 somewhat larger than the width of the active region 1 so that it will certainly contain the entirety of the part of the gate electrode 4b that lies right on the active region 1. Note that care should be taken so that both ends of the gate electrode 4b are not exposed in the opening 11.

Next, the gate electrode 4b is lightly etched by isotropic dry etching or wet etching using the second resist mask 10 as a mask and it is thus thinned. During this process, both ends of the gate electrode 4b, covered by the second resist mask 10, are not etched and therefore remains unthinned.

After that, the second resist mask 10 is removed by ashing and, as shown in FIG. 18A, a thinned gate electrode 4c is obtained in which only the part located on the active region 1 has been thinned. In this preferred embodiment, as shown in FIG. 18C, the thinned gate electrode 4c thus obtained has a smaller vertical thickness in the part located on the active region 1 than in the portions at both ends, since the upper surface of the part on the active region 1 (i.e. the thinned portion) is also etched during the etching for thinning it. On the other hand, both ends of the gate electrode 4b are not etched during the etching and therefore the thinned gate electrode 4c is not shortened in the length direction from the length of the gate electrode 4b not thinned yet.

As shown above, in the semiconductor device of this preferred embodiment, as in the first preferred embodiment, the part of the thinned gate electrode 4c which lies on the active region 1 is thinned and so the gate length (channel length) of the transistor is shortened, which contributes to achievement of higher operation speed of the semiconductor device. Furthermore, as can be understood from the process described above, the process of thinning the gate electrode 4b does not shorten its length and therefore it is not necessary to size the gate electrode 4b larger before it is thinned, which contributes to achievement of higher integration of the semiconductor device.

Also in this preferred embodiment, the thinned gate electrode 4c may be made of Poly-Si or any other gate electrode materials such as metal materials like W. Further, the formation of the first resist mask 6, the second resist mask 10, etc. can use any lithography techniques using electron-beam exposure, X-ray exposure, etc., as well as optical exposure.

Furthermore, also in this preferred embodiment, before formation of the second resist mask 10, an antireflection agent may be applied to or formed as a film on the underlayer in order to suppress reflection from the underlayer during the exposure for forming the opening 11 in the second resist mask 10 over the active region. In this case, as has been described in the first preferred embodiment, the antireflection coating 16 in the opening 11 is first removed to expose the gate electrode 4b, and then the gate electrode 4b is thinned.

If the purpose is just to prevent the thinned gate electrode 4c from being shortened, the second resist mask 10 can be arbitrarily shaped as long as it covers at least both ends in the length direction of the gate electrode 4b and it leaves uncovered at least the part of the gate electrode 4b which lies right on the active region 1. However, in this preferred embodiment, shaping the second resist mask 10 to cover the isolation oxide films 2 as shown in FIGS. 17A and 17B prevents the isolation oxide films 2 from being unnecessarily etched during the thinning of the gate electrode 4b.

<Fifth Preferred Embodiment>

In the first to third preferred embodiments, the second resist mask 10 as the second protective film is shaped so that it covers both ends in the length direction of the first protective film before it is thinned (the hard mask 5a in the first preferred embodiment, the hard mask 20 in the second preferred embodiment, and the first resist mask 6 in the third preferred embodiment), and so that it leaves uncovered the entirety of the part of the first protective film which lies right above the active region 1. Furthermore, in the fourth preferred embodiment, it is shaped so that it covers both ends in the length direction of the gate electrode 4b which has been patterned using the first protective film (first resist mask 6) and so that it leaves uncovered the entirety of the part of the gate electrode 4b which lies right over the active region 1. This preferred embodiment describes a method for forming the pattern for the second resist mask 10.

Figure 19A:
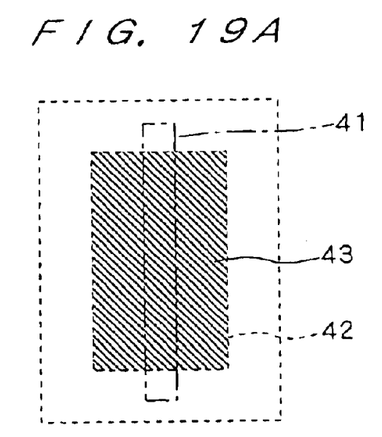
FIGS. 19A and 19B are diagrams used to describe a method for forming a pattern for the second protective film according to a fifth preferred embodiment.
Figure 19B:
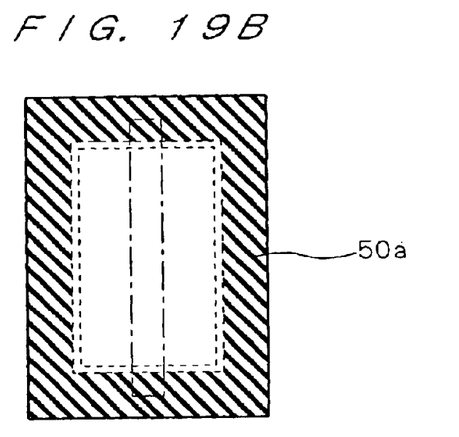

FIGS. 19A and 19B are diagrams used to explain a method for forming the pattern of the second protective film (the second resist mask 10) according to a fifth preferred embodiment. First, with a CAD system, as shown in FIG. 19A, the pattern 41 of the first protective film (i.e. the pattern of the gate electrode before thinned) and the pattern 42 of the active region 1 are superimposed and the pattern 42 of the active region 1 which contains the overlap portion with the pattern 41 of the first protective film is extracted (i.e. the region 43 shown with slanting lines in the diagram). Then, by CAD processing, a pattern 50a for the second protective film is formed in which the region 43 forms an opening. At this time, as shown in FIG. 19B, the region 43 is somewhat enlarged by CAD to form the opening, considering dimension variation and positional shift due to alignment error.

With this CAD processing, the pattern 50a for the second protective film is obtained, where it contains both ends of the pattern 41 of the first protective film and has an opening in the part where the pattern 41 of the first protective film and the pattern 42 of the active region 1 overlap.

The second protective film is formed by using the pattern 50a thus obtained and the second protective film (the second resist mask 10) of the present invention can be formed so as to cover both ends of the first protective film (or the gate electrode formed by using it) before it is thinned and so as to leave uncovered the entirety of the part of the first protective film (or the gate electrode formed using it) which lies right over the active region 1.

<Sixth Preferred Embodiment>

Figure 20A:
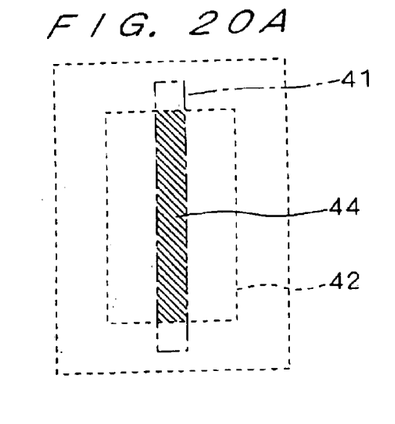
FIGS. 20A and 20B are diagrams used to describe a method for forming a pattern for the second protective film according to a sixth preferred embodiment.
Figure 20B:
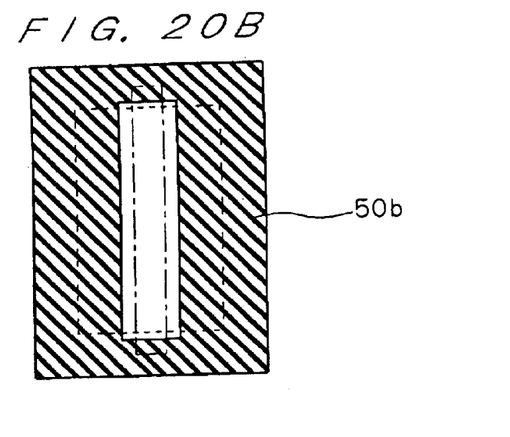

FIGS. 20A and 20B are diagrams used to explain a method for forming the pattern for the second protective film (the second resist mask 10) according to a sixth preferred embodiment. First, with a CAD system, as shown in FIG. 20A, the pattern 41 of the first protective film (i.e. the pattern of the gate electrode before thinned) and the pattern 42 of the active region 1 are superimposed and the region 44 where the pattern 41 of the first protective film and the pattern 42 of the active region 1 overlap is extracted. Then, by CAD processing, a pattern 50b for the second protective film is formed in which the region 44 forms an opening. At this time, as shown in FIG. 20B, the region 44 is somewhat enlarged by CAD to form the opening, considering dimension variation and positional shift due to alignment error.

With this CAD processing, the pattern 50b for the second protective film is obtained, where it contains both ends of the pattern 41 of the first protective film and has an opening in the part where the pattern 41 of the first protective film and the pattern 42 of the active region 1 overlap.

The second protective film is formed by using the pattern 50b thus obtained and the second protective film (the second resist mask 10) of the present invention can be formed so as to cover both ends of the first protective film (or the gate electrode formed by using it) before it is thinned and so as to leave uncovered the entirety of the part of the first protective film (or the gate electrode formed using it) which lies right over the active region 1.

<Seventh Preferred Embodiment>

Figure 21A:
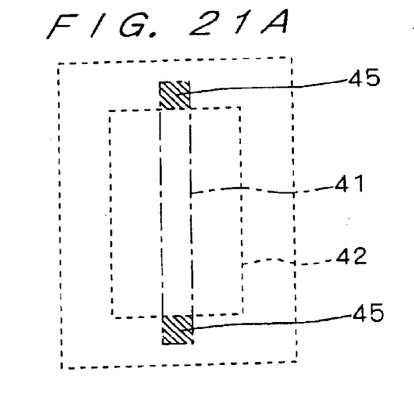
FIGS. 21A and 21B are diagrams used to describe a method for forming a pattern for the second protective film according to a seventh preferred embodiment.

FIGS. 21A and 21B are diagrams used to explain a method for forming the pattern for the second protective film (the second resist mask 10) according to a seventh preferred embodiment. First, with a CAD system, as shown in FIG.

Figure 21B:
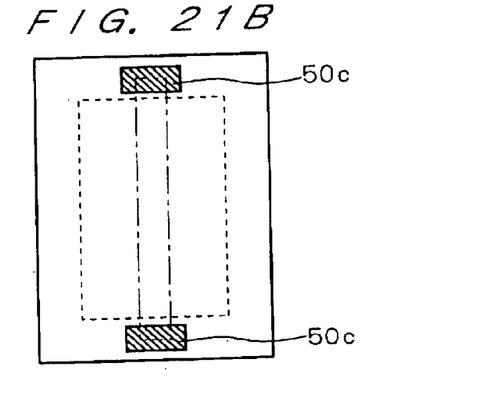

21A, the pattern 41 of the first protective film (i.e. the pattern of the gate electrode before thinned) and the pattern 42 of the active region 1 are superimposed and the regions 45 of the pattern 41 of the first protective film which are located outside the pattern 42 of the active region 1 are extracted. Then, by CAD processing, a pattern 50c for the second protective film is formed in the positions of the regions 45. At this time, as shown in FIG. 21B, considering dimension variation and positional shift due to alignment error, the regions 45 are somewhat enlarged by CAD so that the pattern 50c of the second protective film certainly covers both ends of the pattern 41 of the first protective film, and a margin is formed by CAD between the regions 45 and the pattern 42 of the active region 1 to ensure that the pattern 42 of the active region 1 is not covered by the pattern 50c of the second protective film.

With this CAD processing, the pattern 50c for the second protective film is obtained, where it contains both ends of the pattern 41 of the first protective film and does not contain the part where the pattern 41 of the first protective film and the pattern 42 of the active region 1 overlap.

The second protective film is formed by using the pattern 50c thus obtained and the second protective film (the second resist mask 10) of the present invention can be formed so as to cover both ends of the first protective film (or the gate electrode formed by using it) before it is thinned and so as to leave uncovered the entirety of the part of the first protective film (or the gate electrode formed using it) which lies right over the active region 1.

While the invention has been described in detail, the foregoing description is in all aspects illustrative and not restrictive. It is understood that numerous other modifications and variations can be devised without departing from the scope of the invention.

What is claimed is:

1. A semiconductor device manufacturing method, comprising the steps of:
    (a) forming a gate insulating film on a semiconductor substrate having an active region formed in its surface and forming a gate electrode material film on said gate insulating film;
    (b) forming on said gate electrode material film a first protective film in the shape of a line crossing said active region;
    (c) forming a second protective film which covers at least both ends in the length direction of said first protective film and which leaves uncovered at least a part of said first protective film which lies right above said active region;
    (d) thinning said first protective film using said second protective film as a mask; and
    (e) etching said gate electrode material film using said thinned first protective film as a mask, so as to form a gate electrode.

2. The semiconductor device manufacturing method according to claim 1, wherein
    said first protective film is a hard mask and said second protective film is a resist mask, and said thinning in said step (d) is achieved by etching.

3. The semiconductor device manufacturing method according to claim 1, wherein
    said first protective film is a hard mask of an organic compound and said second protective film is a resist mask,
    said thinning in said step (d) is achieved by ashing, and
    said resist mask exhibits a higher ashing rate during said ashing than said organic compound hard mask.

4. The semiconductor device manufacturing method according to claim 1, wherein
    said first protective film is a first resist mask and said second protective film is a second resist mask,
    said semiconductor device manufacturing method further comprises the step (f) of curing said first resist mask prior to said step (c), and
    said thinning in said step (d) is achieved by ashing.

5. The semiconductor device manufacturing method according to claim 1, wherein
    said second protective film is formed by a pattern having an opening which corresponds to a pattern of said active region.

6. The semiconductor device manufacturing method according to claim 1, wherein
    said second protective film is formed by a pattern having an opening which corresponds to a region in which a pattern of said active region and a pattern of said first protective film overlap when superimposed.

7. The semiconductor device manufacturing method according to claim 1, wherein
    said second protective film is formed by a pattern which corresponds to part of a pattern of said first protective film which, when a pattern of said active region and the pattern of said first protective film are superimposed, resides outside the pattern of said active region.

8. A semiconductor device manufacturing method, comprising the steps of:
    (a) forming a gate insulating film on a semiconductor substrate having an active region formed in its surface and forming a gate electrode material film on said gate insulating film;
    (b) forming on said gate electrode material film a first protective film in the shape of a line crossing said active region;
    (c) etching said gate electrode material film using said first protective film as a mask to form a gate electrode;
    (d) forming a second protective film which covers at least both ends in the length direction of said gate electrode and which leaves uncovered at least a part of said gate electrode which lies on said active region; and
    (e) thinning said gate electrode by etching using said second protective film as a mask.

9. The semiconductor device manufacturing method according to claim 8, wherein
    said second protective film is formed by a pattern having an opening which corresponds to a pattern of said active region.

10. The semiconductor device manufacturing method according to claim 8, wherein
    said second protective film is formed by a pattern having an opening which corresponds to a region in which a pattern of said active region and a pattern of said first protective film overlap when superimposed.

11. The semiconductor device manufacturing method according to claim 8, wherein
    said second protective film is formed by a pattern which corresponds to part of a pattern of said first protective film which, when a pattern of said active region and the pattern of said first protective film are superimposed, resides outside the pattern of said active region.

* * * * *